United States Patent
Tomita et al.

(10) Patent No.: US 9,844,133 B2
(45) Date of Patent: Dec. 12, 2017

(54) FLEXIBLE SUBSTRATE INCLUDING STRETCHABLE SHEET

(71) Applicant: Panasonic Intellectual Property Management Co., Ltd., Osaka (JP)

(72) Inventors: Yoshihiro Tomita, Osaka (JP); Koichi Hirano, Osaka (JP); Susumu Sawada, Osaka (JP); Koji Kawakita, Nara (JP); Takashi Ichiryu, Osaka (JP); Masanori Nomura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/363,579

(22) Filed: Nov. 29, 2016

(65) Prior Publication Data
US 2017/0181277 A1    Jun. 22, 2017

(30) Foreign Application Priority Data

Dec. 21, 2015  (JP) .................................. 2015-249034

(51) Int. Cl.
*H05K 1/18*    (2006.01)
*H05K 1/03*    (2006.01)

(52) U.S. Cl.
CPC .............. *H05K 1/038* (2013.01); *H05K 1/18* (2013.01); *H05K 2201/05* (2013.01)

(58) Field of Classification Search
CPC .................................. H05K 1/03; H05K 1/18
USPC ....................................................... 361/749
See application file for complete search history.

(56) References Cited

U.S. PATENT DOCUMENTS

| 7,265,298 | B2 * | 9/2007  | Maghribi ............. | A61N 1/0551 |
|           |      |         |                       | 174/254     |
| 7,491,892 | B2 * | 2/2009  | Wagner ................ | H05K 1/0283 |
|           |      |         |                       | 174/254     |
| 8,332,053 | B1 * | 12/2012 | Patterson ............ | H01L 23/5387 |
|           |      |         |                       | 600/393     |
| 9,247,637 | B2 * | 1/2016  | Hsu ...................... | H05K 1/0271 |
| 9,706,647 | B2 * | 7/2017  | Hsu ...................... | H05K 1/0283 |
| 2002/0076948 | A1 | 6/2002 | Farrell et al.         |             |
| 2004/0192082 | A1 * | 9/2004 | Wagner ................ | H05K 1/0283 |
|              |      |        |                       | 439/67      |
| 2007/0222909 | A1 | 9/2007 | Slikkerveer et al.    |             |
| 2012/0051005 | A1 * | 3/2012 | Vanfleteren ........... | H01L 21/565 |
|              |      |        |                       | 361/749     |

(Continued)

FOREIGN PATENT DOCUMENTS

JP    1-135758 U    9/1989
JP    2-235387      9/1990

(Continued)

*Primary Examiner* — Timothy Thompson
*Assistant Examiner* — Michael F McAllister
(74) *Attorney, Agent, or Firm* — McDermott Will & Emery LLP

(57) ABSTRACT

A flexible substrate is provided with: a stretchable sheet; a member located on the sheet; and a stretchable strip connected to the member, and located on the sheet. When the amount of extension of the sheet is equal to or less than a predetermined value, the sheet has a first elastic modulus, and when the amount of extension of the sheet exceeds the predetermined value, the sheet has a second elastic modulus that is greater than the first elastic modulus and greater than the elastic modulus of the strip.

19 Claims, 19 Drawing Sheets

(56) References Cited

U.S. PATENT DOCUMENTS

| | | | | |
|---|---|---|---|---|
| 2012/0103683 A1* | 5/2012 | Ishida | ............... | H05K 1/038 174/70 R |
| 2013/0256921 A1* | 10/2013 | Huang | ............... | H01L 23/528 257/786 |
| 2014/0022746 A1* | 1/2014 | Hsu | ............... | H05K 1/0271 361/750 |
| 2014/0295150 A1* | 10/2014 | Bower | ............... | C09J 7/02 428/201 |
| 2015/0037554 A1* | 2/2015 | Gao | ............... | C03C 17/22 428/217 |
| 2015/0189741 A1* | 7/2015 | Hong | ............... | H05K 1/0283 174/254 |
| 2015/0216037 A1 | 7/2015 | Tomita et al. | | |

FOREIGN PATENT DOCUMENTS

| | | |
|---|---|---|
| JP | 2000-294886 | 10/2000 |
| JP | 2004-071562 | 3/2004 |
| JP | 2004-513247 | 4/2004 |
| JP | 2004-349002 | 12/2004 |
| JP | 2008-501133 | 1/2008 |
| JP | 2013-187308 | 9/2013 |
| JP | 2015-164177 | 9/2015 |

\* cited by examiner

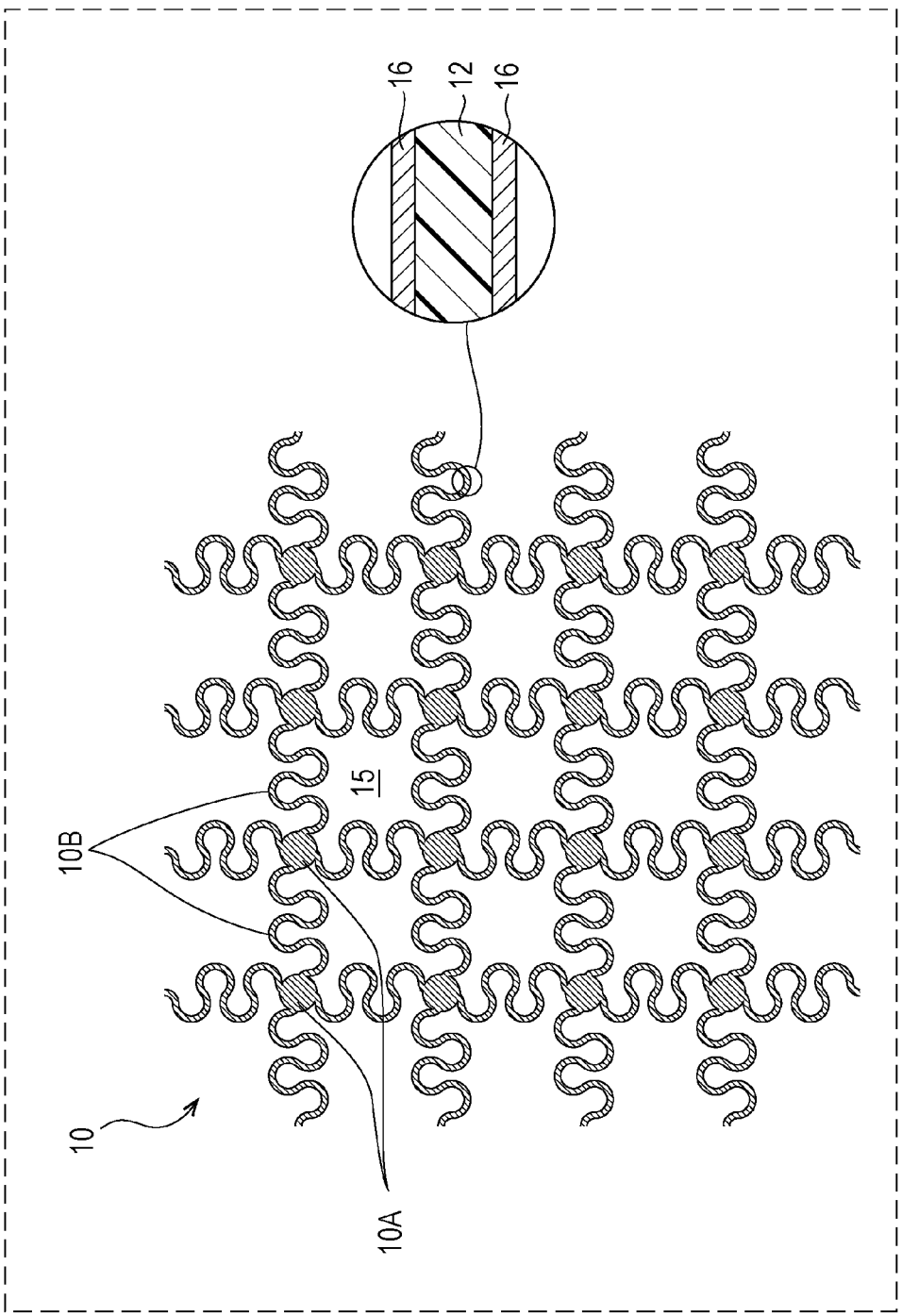

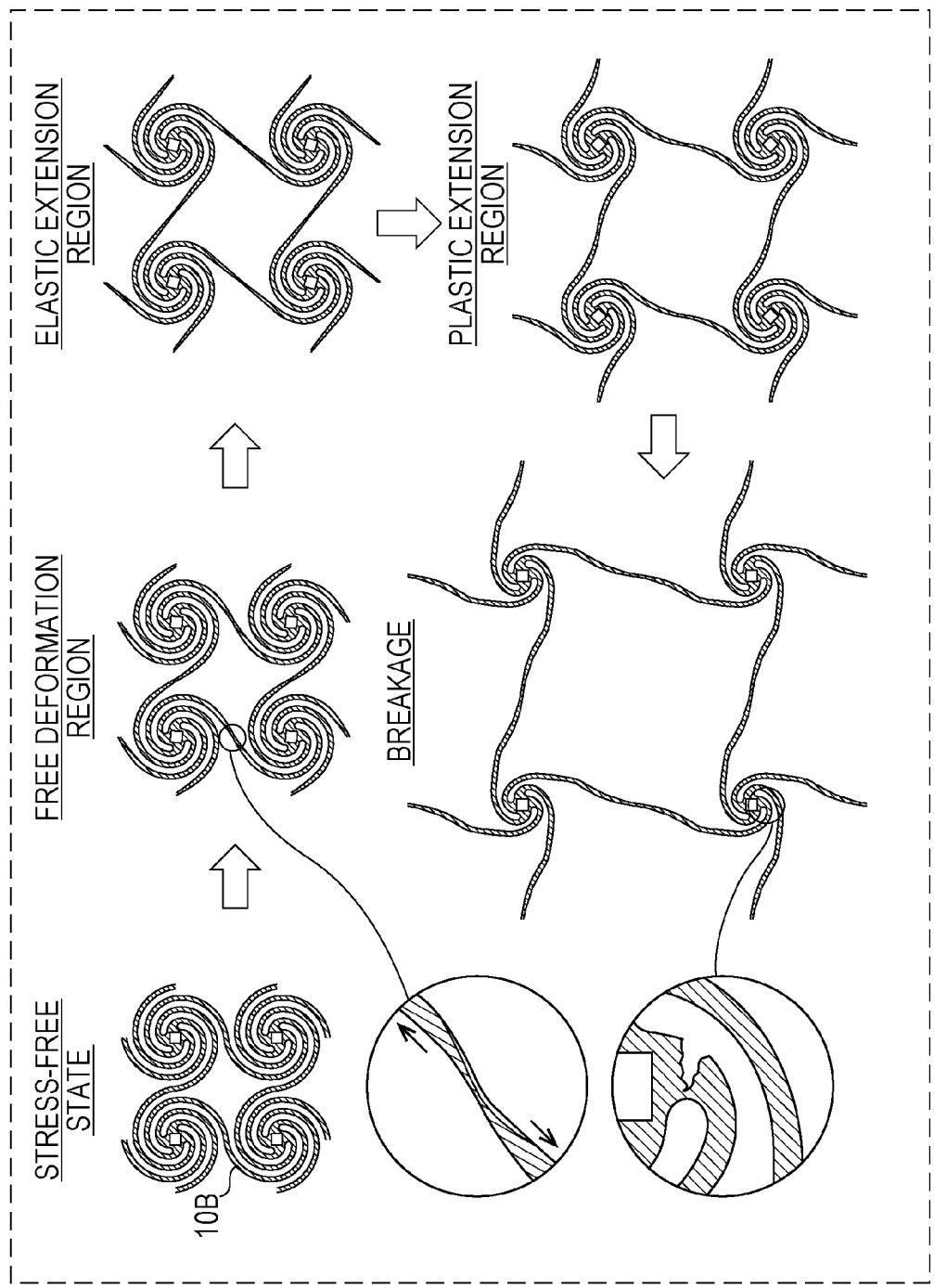

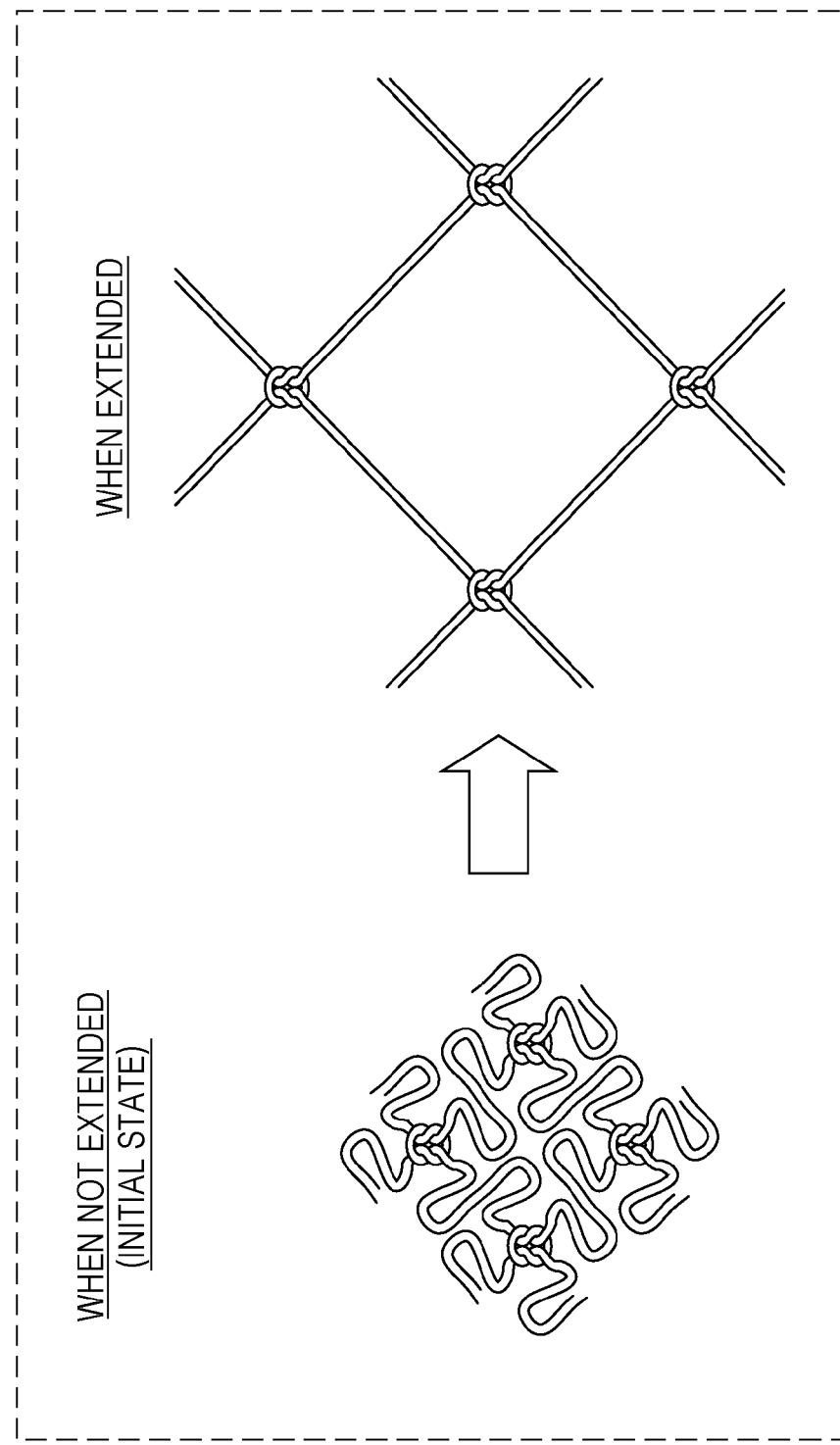

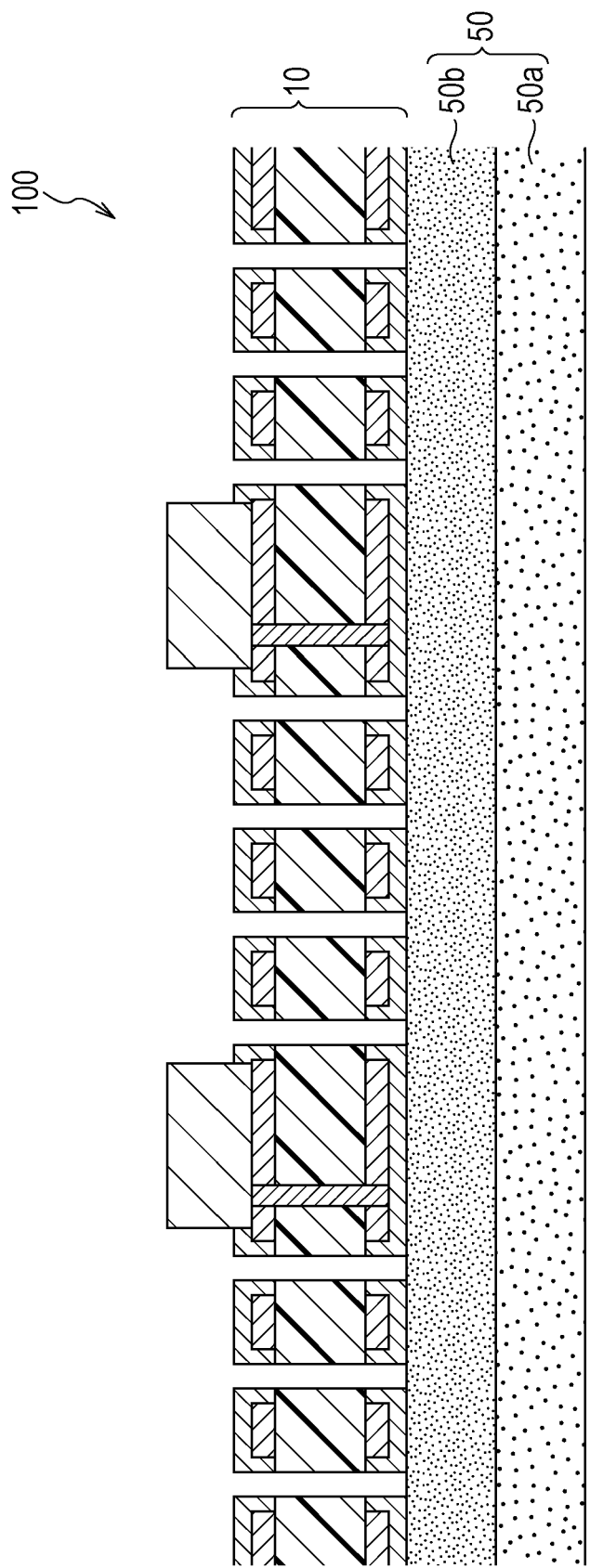

FLEXIBLE SUBSTRATE INCLUDING STRETCHABLE SHEET

BACKGROUND

1. Technical Field

The present disclosure relates to a flexible substrate.

2. Description of the Related Art

Flexible substrates have often been used in recent years due to the miniaturization and/or thinning of electronic devices. The use of flexible substrates has been achieved in various fields besides the field of typical electronic devices. For example, flexible substrates have been used in mobile devices such as smartphones and also wearable devices.

Wearable devices are required to be able to easily attach to movable parts of a measurement subject (a human body, for example), and to be able to perform sensing in close contact with the measurement subject. Consequently, flexible substrates are required to have sufficient stretchability. A flexible substrate having a serpentine structure is known as prior art (Japanese Unexamined Patent Application Publication No. 2000-294886).

SUMMARY

In one general aspect, the techniques disclosed here feature a flexible substrate that is provided with: a stretchable sheet; a member located on the sheet; and a stretchable strip connected to the member on the sheet. When the amount of extension of the sheet is equal to or less than a predetermined value, the sheet has a first elastic modulus, and when the amount of extension of the sheet exceeds the predetermined value, the sheet has a second elastic modulus that is greater than the first elastic modulus and greater than the elastic modulus of the strip.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2A is a drawing schematically depicting an example of a wiring layer of a stretchable flexible substrate according to an embodiment;

FIG. 8 is a schematic drawing for illustrating the stretching behavior of stretchable strips that curve in a spiral shape;

FIG. 12B is a schematic drawing for illustrating deformation of a fiber knitted material having a net structure;

FIG. 15 is a cross-sectional drawing schematically depicting an example of a configuration of a stretchable flexible substrate according to an embodiment.

DETAILED DESCRIPTION

Figure 1:
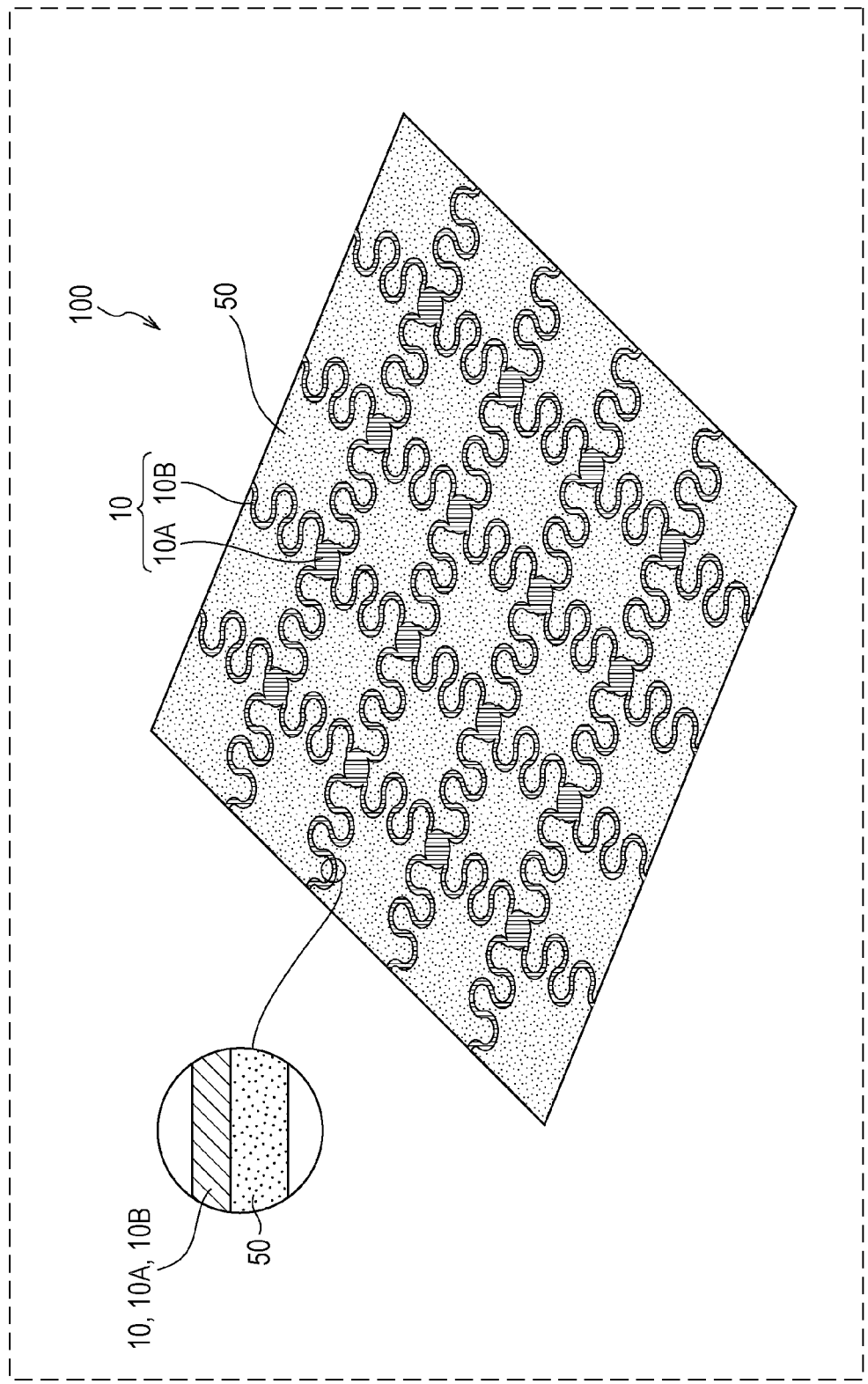
FIG. 1 is a drawing schematically depicting a stretchable flexible substrate according to an embodiment.

First, the circumstances that led to the present inventors devising the stretchable flexible substrate of the present disclosure will be described. The present inventors discovered the following four problems.

(1) With a conventional flexible substrate, stretching in the direction of extension of the flexible substrate is possible but stretching in a direction that is different from the direction of extension is difficult. Thus, it is difficult for sufficient stretchability of a level that meets market needs to be exhibited.

(2) With a conventional flexible substrate, there is a risk of a breakage or disconnection occurring at locations where stress is likely to concentrate due to stretching.

(3) With a conventional flexible substrate, it is extremely difficult to ensure high stretchability and also to prevent a breakage or disconnection of wiring caused by an unforeseen tensile force.

(4) With a conventional flexible substrate, there is a risk of the flexible substrate maintaining an extended state after having been extended once.

The abovementioned point (3) will be described in detail. By designing the width of a serpentine structure to be wide, it is possible for the cross-sectional area of a cross section that intersects the tensile direction to be increased, and for the substrate to be strengthened. However, when the width of a serpentine structure is increased, the space for meandering of the serpentine structure is reduced, and sufficient stretchability can no longer be obtained. On the other hand, when the width of a serpentine structure is reduced, the space for the meandering of the serpentine structure can be sufficiently ensured, and a sufficient coefficient of extension can be obtained. However, when the width of a serpentine structure is reduced, the cross-sectional area of the cross section that intersects the tensile direction decreases, and it becomes easy for a breakage or disconnection to occur due to a tensile force.

The abovementioned point (4) will be described in detail. In the case where a flexible substrate has a serpentine structure that is easily extended with a small tensile force, the reaction force (in other words, the restoring force) that occurs in the flexible substrate becomes smaller than the external force that is applied to the flexible substrate. Therefore, there is also a risk of a flexible substrate that has been extended once maintaining the extended state. For example, in the case where a flexible substrate is used as a sensor that is fitted to the skin of a person to read biological signals, there is a risk of accurate sensing no longer being possible if the flexible substrate remains extended due to movement of the human body. Thus, in this case, the flexible substrate is required to be restored to the original shape to continue fitting to the skin despite having been extended once.

The present inventors carried out a diligent investigation in order to solve the aforementioned problems, which thereby led to the present inventors devising a flexible substrate capable of preventing plastic deformation of a wiring layer when extended. This flexible substrate has a wiring layer and a non-linear elastic layer. The wiring layer includes a non-stretchable portion and a stretchable strip having one end connected to the non-stretchable portion. When the flexible substrate is extended, the non-linear elastic layer is able to prevent plastic deformation of the wiring layer.

The stretchable strip connected to the non-stretchable portion is able to extend and contract, and therefore the flexible substrate has sufficient stretchability. Furthermore, the non-linear elastic layer exhibits non-linear elasticity, and therefore plastic deformation of the wiring layer is suppressed when the flexible substrate is extended. Thus, breakages or disconnections at locations where stress is likely to concentrate are prevented in particular. Consequently, it is possible for the flexible substrate to have high stretchability and also to prevent a breakage or disconnection of the wiring layer caused by an unforeseen tensile force.

Hereinafter, a stretchable flexible substrate according to an embodiment will be described. The various kinds of elements depicted in the drawings are merely depicted in a schematic manner to aid understanding of the present disclosure, and the dimension ratios, the appearance, and the like may be different from actual elements.

As depicted in FIG. 1, a stretchable flexible substrate 100 according to an embodiment has a wiring layer 10 and a non-linear elastic layer 50. The wiring layer 10 has electrically conductive wiring. The wiring layer 10 includes non-stretchable portions 10A and stretchable strips 10B connected to the non-stretchable portions 10A. The stretchable strips 10B have a shape that is capable of stretching, and the wiring layer 10 is thereby able to stretch. It is desirable for the non-stretchable portions 10A and the stretchable strips 10B to be connected in an integral manner or a continuous manner, for example. That is, it is desirable for the non-stretchable portions 10A and the stretchable strips 10B to be integrated without joints. The non-linear elastic layer 50 prevents a breakage or disconnection of the wiring layer 10. In other words, the non-linear elastic layer 50 is able to function as a layer that protects the wiring layer 10.

The non-linear elastic layer 50 in the present embodiment is an example of a "sheet" in the present disclosure. The non-stretchable portions 10A in the present embodiment are an example of a "non-stretchable member" in the present disclosure. The stretchable strips 10B in the present embodiment are an example of a "strip" in the present disclosure.

Figure 2B:
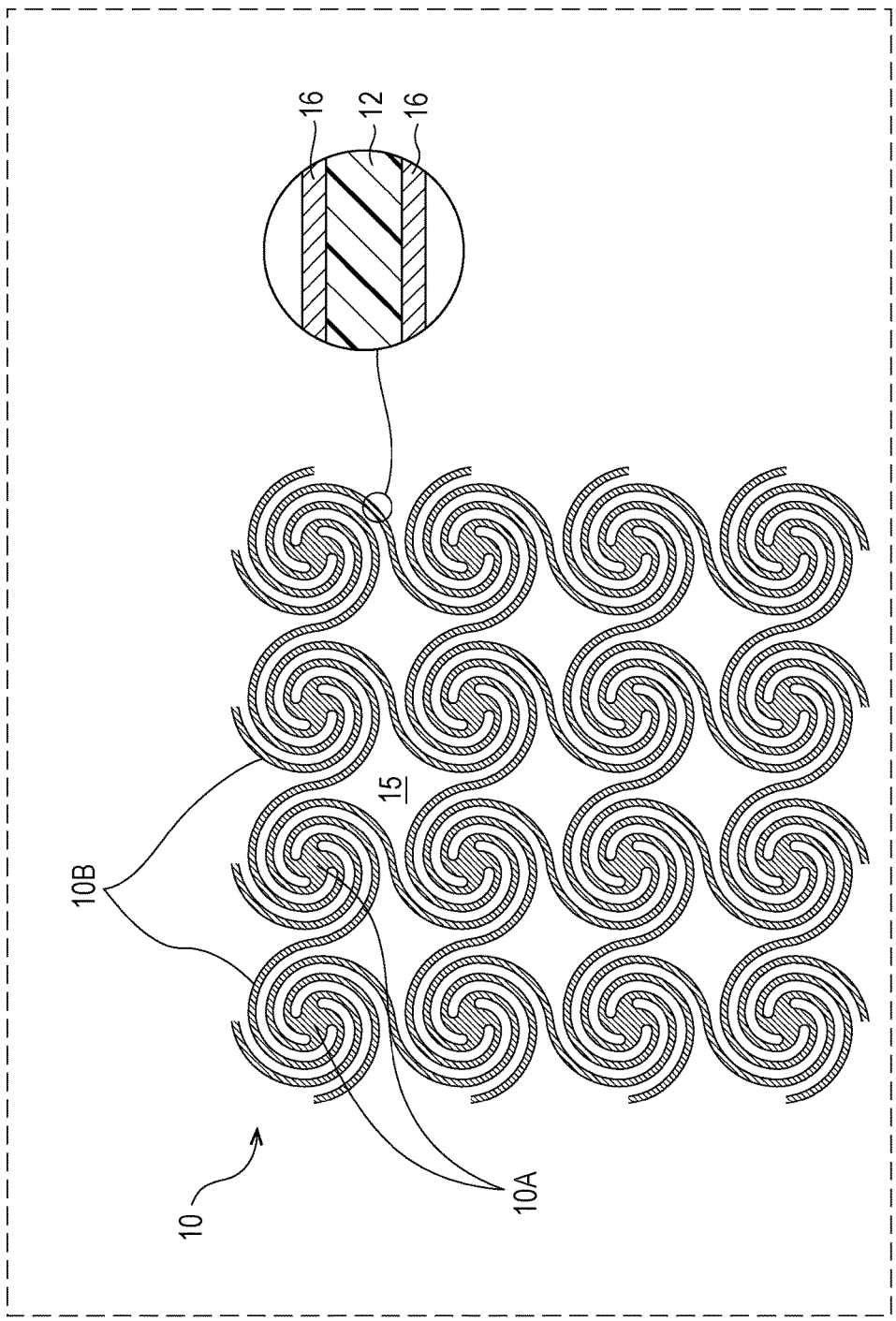
FIG. 2B is a drawing schematically depicting an example of a wiring layer of a stretchable flexible substrate according to an embodiment.

FIGS. 2A and 2B depict only the wiring layer 10. As depicted in the drawings, in the wiring layer 10, a plurality of non-stretchable portions 10A are provided, and adjacent non-stretchable portions 10A are connected to each other by a stretchable strip 10B. The plurality of non-stretchable portions 10A may be arranged in a two-dimensional matrix form, and the stretchable strips 10B may also be arranged in a two-dimensional matrix form in such a way as to connect the non-stretchable portions 10A. It is desirable for the stretchable strips 10B to have curved sections. In this case, the stretchable strips 10B extend and contract due to changes in the curvature of the curved sections, and thus the wiring layer 10 overall exhibits stretchability. Two or more stretchable strips 10B are provided for each non-stretchable portion 10A. It is desirable for the plurality of stretchable strips 10B to be separated from each other by gaps 15. The degree of freedom of the changes in the curvature of the stretchable strips 10B increases as the gaps 15 become larger, thereby facilitating stretching of the stretchable flexible substrate 100 overall.

The stretchable strips 10B curve in a serpentine shape or a spiral shape, for example. In plan view, the stretchable strips 10B depicted in FIG. 2A have a serpentine shape. In other words, the stretchable strips 10B depicted in FIG. 2A have a meandering shape. Non-stretchable portions 10A that are adjacent to each other are connected by way of a stretchable strip 10B that curves in a serpentine shape therebetween. In plan view, the stretchable strips 10B depicted in FIG. 2B are coiled in spirals. Non-stretchable portions 10A that are adjacent to each other are connected by way of a stretchable strip 10B that curves in a spiral shape therebetween.

In the case where a plurality of non-stretchable portions 10A are arranged with a predetermined pitch, a wiring layer 10 that has spiral-shaped stretchable strips 10B is able to extend to a greater extent than a wiring layer 10 that has serpentine-shaped stretchable strips 10B. This is due to the following two reasons.

(1) The curved sections of a spiral-shaped stretchable strip 10B curve with a greater radius of curvature than the curved sections of a serpentine-shaped stretchable strip 10B. It is thereby possible to obtain a greater allowance in length for the stretchable strips 10B.

(2) A spiral-shaped stretchable strip 10B displaces in such a way that the spirals loosen, and therefore this displacement assists the extension of the stretchable strip.

Furthermore, a wiring layer 10 that has spiral-shaped stretchable strips 10B is able to be extended by means of a smaller tensile force than a wiring layer 10 that has serpentine-shaped stretchable strips 10B.

Figure 3:
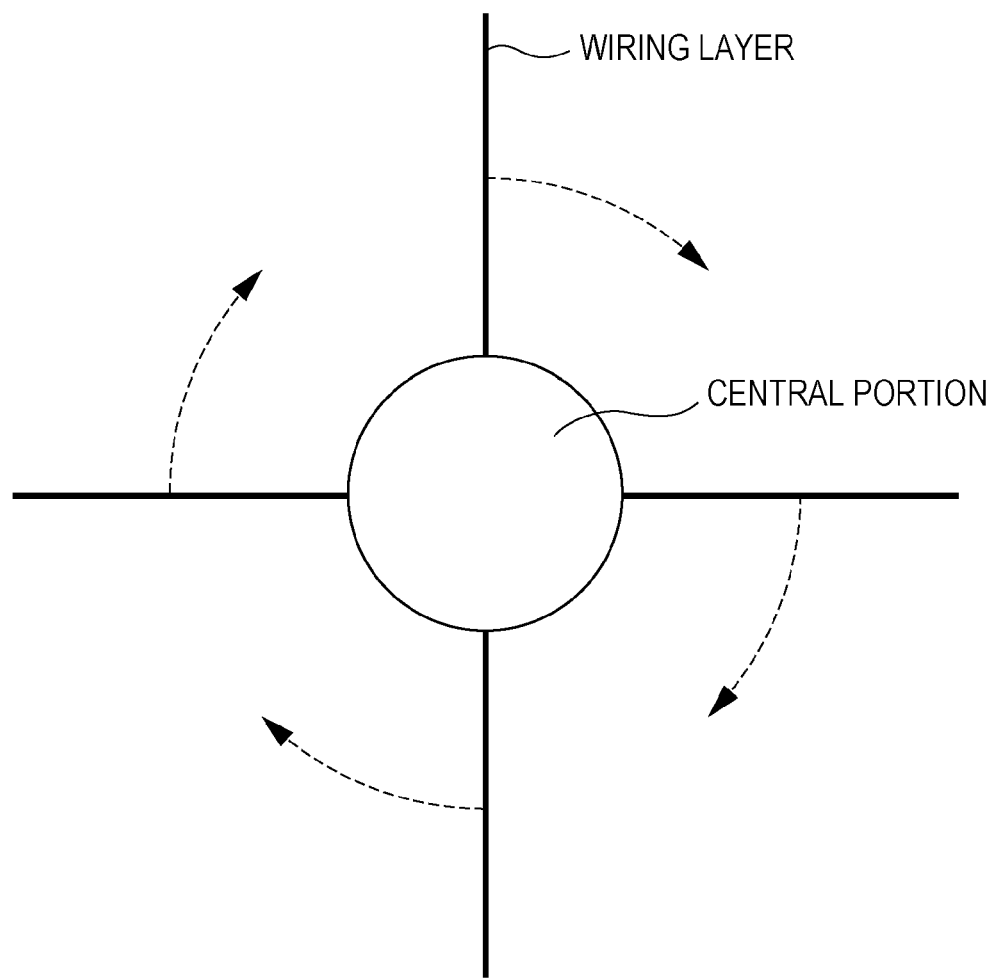
FIG. 3 is a schematic drawing for illustrating an example of the relationship between a wiring layer and the direction of a force applied to the wiring layer.

For example, as depicted in FIG. 3, spiral-shaped stretchable strips 10B are obtained by wiring that extends from a central portion (a non-stretchable portion 10A, for example) being made to curve in a clockwise direction as indicated by the dashed arrows. The curvature of the spiral-shaped stretchable strips 10B decreases as the stretchable flexible substrate 100 extends. Thus, the stretchable strips 10B deform in such a way as to move away from the outer periphery of a non-stretchable portion 10A, from the one end connected to the non-stretchable portion 10A toward the other end. The spiral-shaped stretchable strips 10B desirably extend along at least half of a perimeter of a non-stretchable portion 10A. For example, the spiral-shaped stretchable strips 10B may extend along a perimeter of a non-stretchable portion 10A one or more times, or may extend along a perimeter a non-stretchable portion 10A three or more times. It should be noted that the shape of the non-stretchable portions 10A is not particularly restricted. The shape of the non-stretchable portions 10A may be a circle, or may be a polygon such as a quadrilateral or a hexagon. The curved sections of the stretchable strips 10B may be curved in a curved line shape, or may be bent in an angular manner.

The wiring layer 10 includes electrically conductive wiring. For example, as depicted in the partial cross-sectional views in FIGS. 2A and 2B, the wiring layer 10 includes an insulating base material 12 and electrically conductive wiring 16. The electrically conductive wiring 16 is provided on the main surfaces of the insulating base material 12, for example. In other words, the insulating base material 12 and the electrically conductive wiring 16 are layered on each another.

The insulating base material 12 has an electrical insulating property. It is desirable for the insulating base material 12 to have a sheet shape. It is desirable for the insulating base material 12 to be flexible. The material for the insulating base material 12 may be a resin material. A possible example of the material for the insulating base material 12 is at least one type of material selected from the group consisting of an acrylic resin, a urethane resin, a silicone resin, a fluororesin, a polyimide resin, an epoxy resin, and the like.

The electrically conductive wiring 16 is electrically conductive. The electrically conductive wiring 16 may be in the form of a thin film. It is desirable for the electrically conductive wiring 16 to contain a metal material. A possible example of a metal material for the electrically conductive wiring 16 is at least one type selected from the group consisting of gold (Au), silver (Ag), copper (Cu), nickel (Ni), chromium (Cr), cobalt (Co), magnesium (Mg), calcium (Ca), platinum (Pt), molybdenum (Mo), iron (Fe), and zinc (Zn). The thickness of the electrically conductive wiring 16, for example, may be of the order of 5 µm to 1000 µm, desirably of the order of 5 µm to 500 µm, and more desirably of the order of 5 µm to 250 µm. The electrically conductive wiring 16 may be a layer formed from metal foil. In this case, the metal foil may be subjected to patterning processing, for example.

Figure 4:
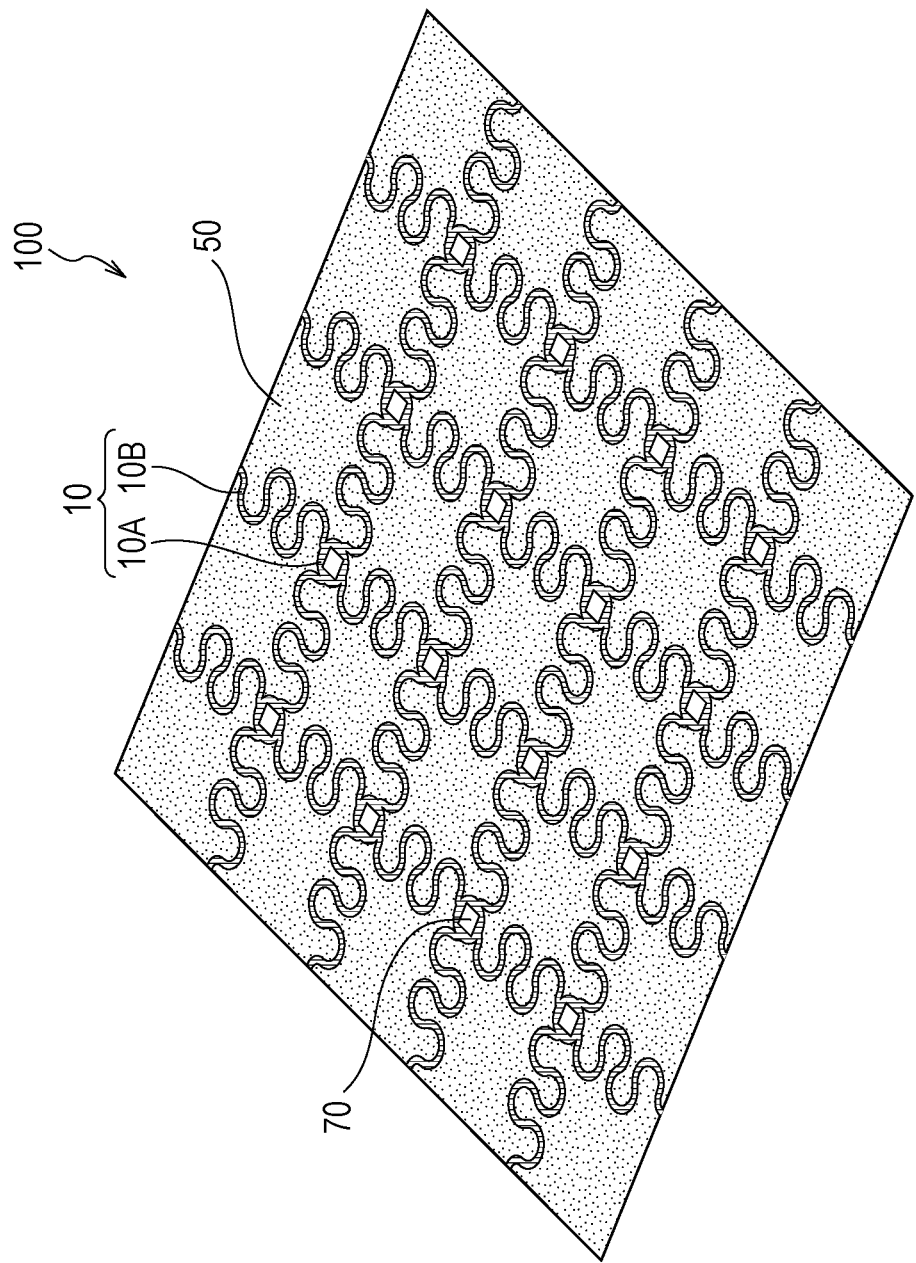
FIG. 4 is a drawing schematically depicting a stretchable flexible substrate according to an embodiment.
Figure 5A:
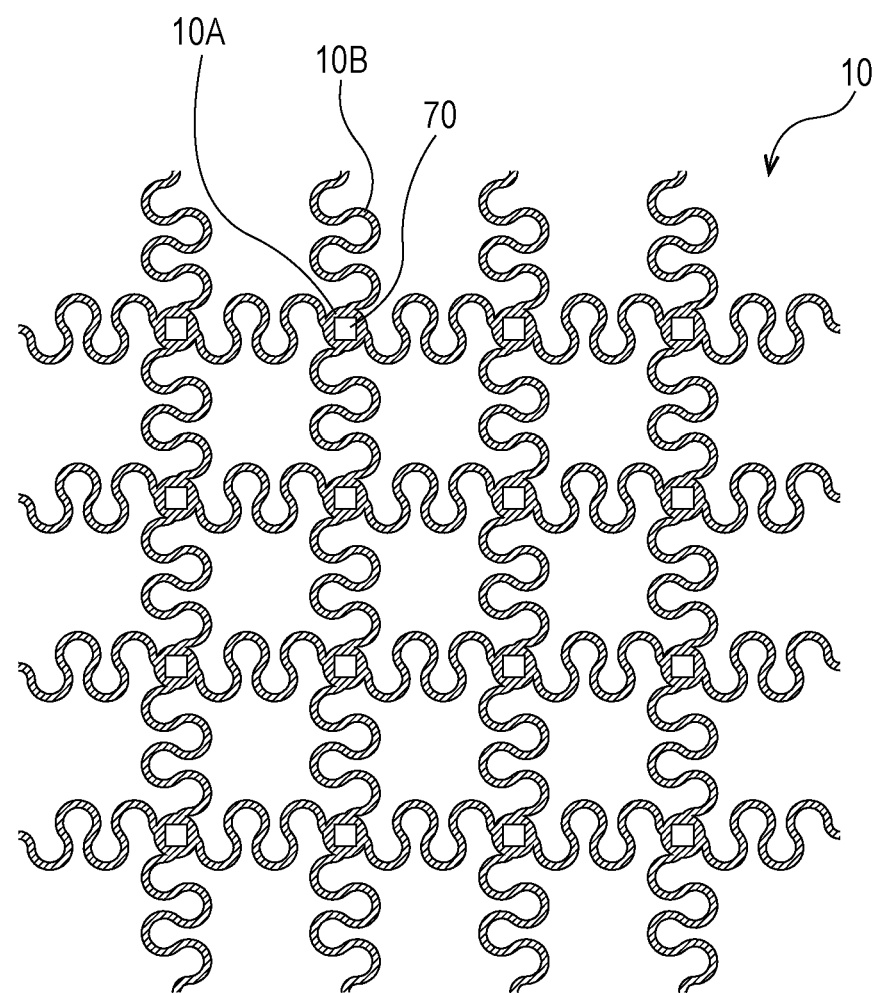
FIG. 5A is a drawing schematically depicting an example of a wiring layer and electronic components of a stretchable flexible substrate according to an embodiment.
Figure 5B:
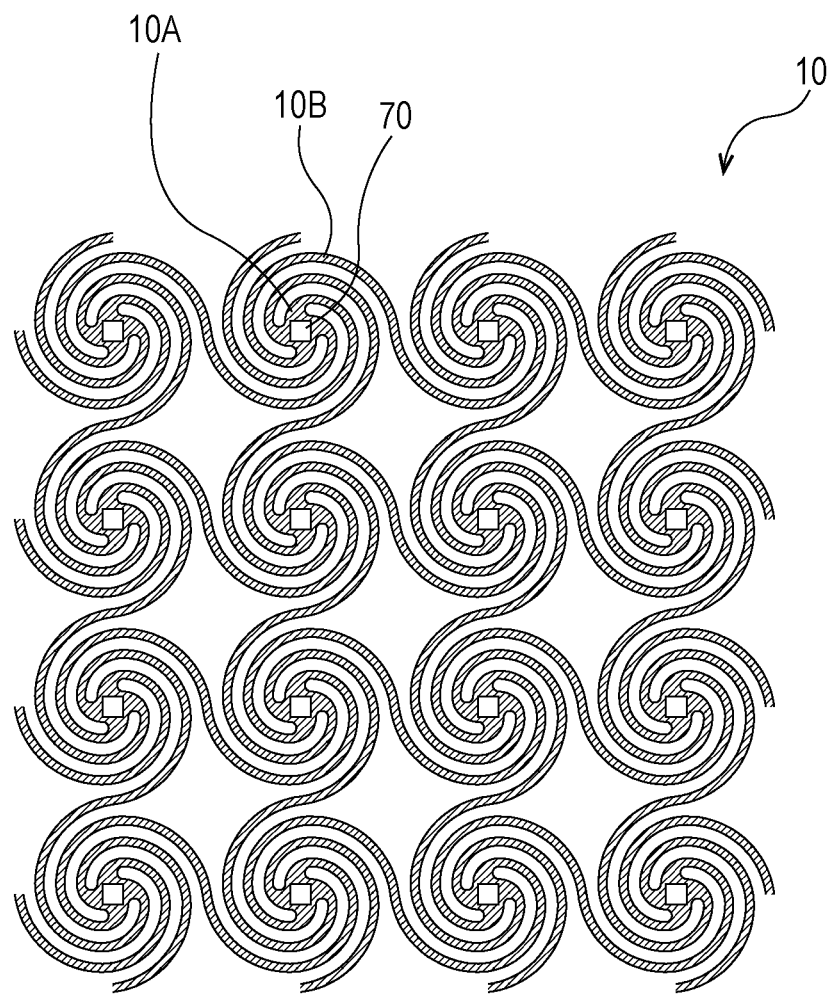
FIG. 5B is a drawing schematically depicting an example of a wiring layer and electronic components of a stretchable flexible substrate according to an embodiment.

For example, as depicted in FIGS. 4, 5A, and 5B, electronic components 70 may be provided on the wiring layer 10. The electronic components 70 are electrically connected to the wiring layer 10 (for example, the electrically conductive wiring 16). It is desirable for the electronic components 70 to be provided on the non-stretchable portions 10A of the wiring layer 10, as depicted in FIGS. 4, 5A, and 5B. The electronic components 70 are less affected by the stretching of the stretchable flexible substrate 100. The electronic components 70 may be various electronic components used in the electronic mounting field, and are not particularly restricted. Possible examples of the electronic components 70 are a semiconductor element, a temperature sensor, a pressure sensor, an actuator, and the like. A semiconductor element is a light-emitting element, a light-receiving element, a diode, or a transistor, for example. Other possible examples of the electronic components 70 are an IC (a control IC, for example), an inductor, a capacitor, a power element, a chip resistor, a chip capacitor, a chip varistor, a chip thermistor, another chip-shaped laminated filter, a connection terminal, and the like. A plurality of types of electronic components 70 may be provided on the stretchable flexible substrate 100.

The non-linear elastic layer 50 is a layer for protecting the wiring layer 10, for example. The non-linear elastic layer 50 comes into contact with the wiring layer 10 in a direct or indirect manner. The wiring layer 10 and the non-linear elastic layer 50 may be layered on each another, as depicted in FIG. 1. A main surface of the wiring layer 10 and a main surface of the non-linear elastic layer 50 face each other. A main surface of the wiring layer 10 is a surface that extends in the direction in which the non-stretchable portions 10A and the stretchable strips 10B are arranged.

Figure 6:
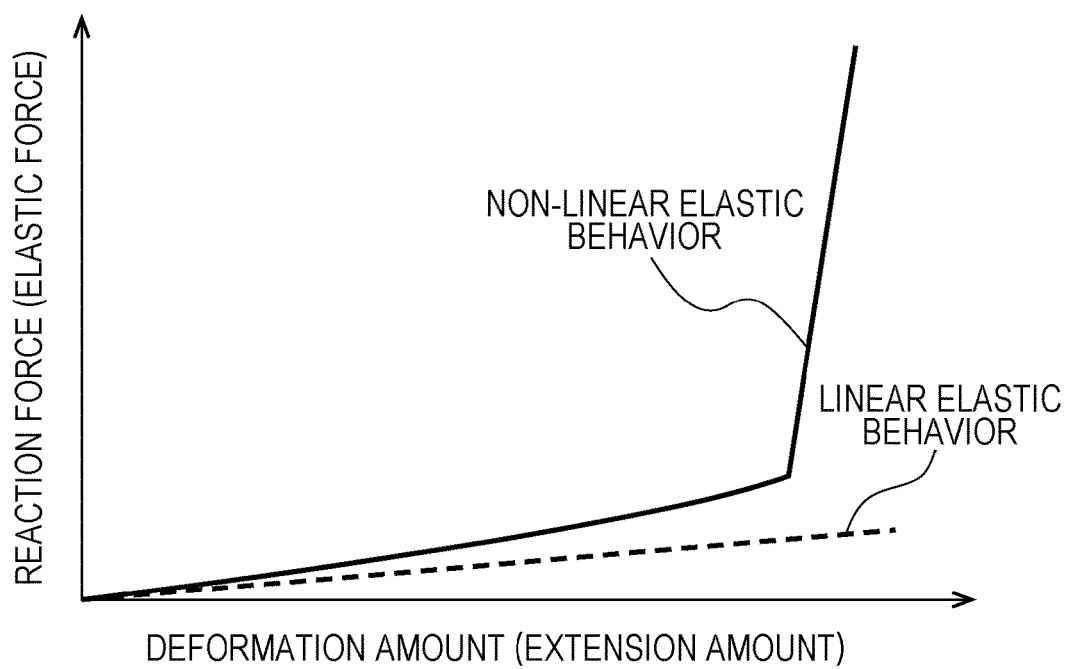
FIG. 6 is a graph depicting non-linear elastic behavior and linear elastic behavior.

In FIG. 6, the solid line represents an example of the stretching characteristics of the non-linear elastic layer 50, and the dashed line represents a comparative example. The non-linear elastic layer 50 deforms due to tension, and practically returns to the original shape when deloaded. "Practically returns to the original shape" implies not only that the non-linear elastic layer 50 completely returns to the original shape but also that the non-linear elastic layer 50 deforms in such a way as to be close to the original shape. In other words, the non-linear elastic layer 50 is an elastic body. As indicated by the solid line in FIG. 6, when the amount of deformation of the non-linear elastic layer 50 exceeds a predetermined level, the reaction force (in other words, the elastic force) with respect to the tension rapidly increases. That is, in this sense, the non-linear elastic layer 50 exhibits non-linear elasticity. The elastic modulus of the non-linear elastic layer 50 rapidly rises when the amount of deformation (the amount of extension, for example) exceeds the predetermined level. It should be noted that it is desirable for the non-linear elastic layer 50 to maintain a high elastic force after the amount of deformation (the amount of extension, for example) has exceeded the predetermined level.

The stretchable flexible substrate 100 is provided with the wiring layer 10, which includes the non-stretchable portions 10A and the stretchable strips 10B, and the non-linear elastic layer 50. Thus, when the stretchable flexible substrate 100 stretches, breaking or disconnecting or the like at locations where stress is likely to concentrate is prevented. In other words, the stretchable flexible substrate 100 has high stretchability, and is able to prevent a breakage or disconnection of wiring caused by an unforeseen tensile force.

For example, the non-linear elasticity of the non-linear elastic layer 50 prevents plastic deformation of the wiring layer. That is, when the amount of extension of the stretchable flexible substrate 100 reaches the predetermined level, the reaction force (in other words, the elastic force) of the non-linear elastic layer 50 rapidly increases. Thus, it is possible to suppress the amount of extension of the stretchable flexible substrate 100 reaching an amount of extension at which plastic deformation is caused in the wiring layer 10.

In the case where a stretchable flexible substrate that is not provided with the non-linear elastic layer 50 is stretched, as the amount of extension of the stretchable flexible substrate increases, the wiring layer first freely deforms, then elastically deforms, then plastically deforms, and finally breaks or disconnects. When the wiring layer plastically deforms, the stretching function of the stretchable flexible substrate is impaired. Furthermore, the risk of a breakage and/or disconnection in the wiring layer increases due to the wiring layer plastically deforming. However, because the stretchable flexible substrate 100 according to the present embodiment has the non-linear elastic layer 50, such plastic deformation of the wiring layer can be prevented.

Here, the "elastic force" and "reaction force" in the present disclosure correspond to a load produced when two points (for example, opposing end portions) of a target member are pulled at a fixed speed in directions of separation from each other.

Hereinafter, the action with which the non-linear elastic layer prevents plastic deformation of the wiring layer will be described in detail. First, the stretching behavior of a stretchable flexible substrate that is not provided with the non-linear elastic layer will be given as an example.

Figure 7:
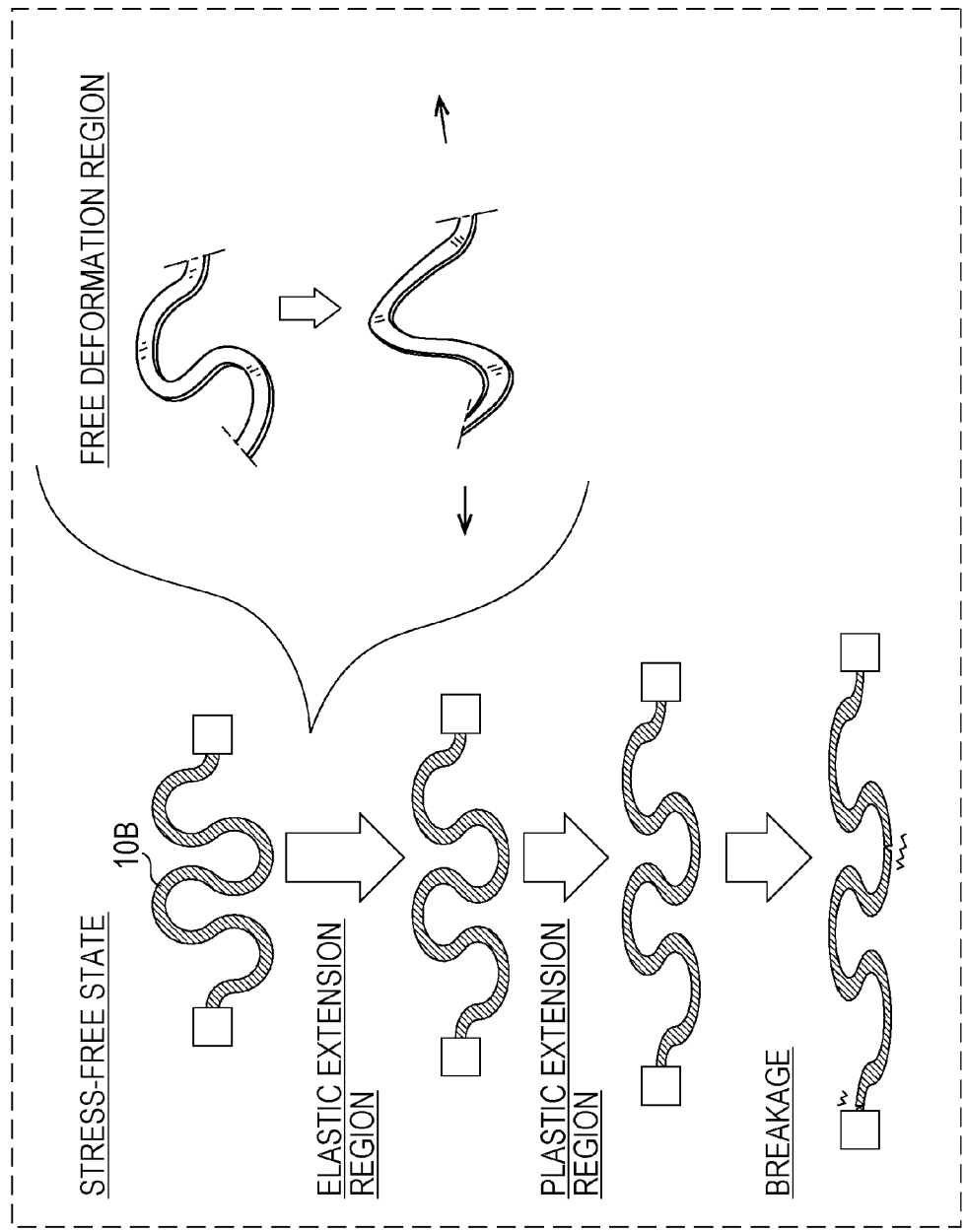
FIG. 7 is a schematic drawing for illustrating the stretching behavior of a stretchable strip that curves in a serpentine shape.

FIG. 7 is a schematic drawing of the stretching behavior of a stretchable strip 10B that curves in a serpentine shape. FIG. 8 is a schematic drawing of the stretching behavior of stretchable strips 10B that curve in a spiral shape.

First, the stretchable strips 10B are in an unstressed state. When the stretchable strips 10B start to be pulled, first, the stretchable strips 10B deform mainly in a three-dimensional manner. For example, the stretchable strips 10B twist and warp in a three-dimensional manner. This kind of initial deformation occurs due to pulling that is particularly small compared to pulling with which the curves of the stretchable strips 10B are widened. That is, the stretchable strips 10B can be deformed in a state in which the reaction force produced in the stretchable strips 10B is low. The more that the "serpentine" or "spiral" shape is increased for there to be allowance, the easier it becomes for the stretchable strips 10B to be deformed with a low reaction force. This kind of region of an amount of extension in which the stretchable strips 10B are easily deformed with a low reaction force is referred to as a "free deformation region".

If the extension of the stretchable strips 10B is subsequently continued, it no longer becomes possible for the extension to be followed merely by the twisting or warping of the stretchable strips 10B, and the curves of the stretchable strips 10B widen and start to extend. In other words, the stretchable strips 10B start to elastically deform. At such time, a reaction force occurs in the stretchable strips 10B that is stronger than in the case where the amount of extension was within the free deformation region. This kind of region in which the stretchable strips 10B elastically deform is referred to as an "elastic extension region". In the case where the amount of extension of the stretchable strips 10B is within the elastic extension region, when the tensile force on the stretchable strips 10B is removed, the stretchable strips 10B return to the prior shape in which elastic deformation is not occurred.

If the extension of the stretchable strips 10B is further continued, the stretchable strips 10B plastically deform. For example, in the case where the stretchable strips 10B include the electrically conductive wiring 16 formed of copper foil or the like, the electrically conductive wiring 16 plastically deforms when the distortion thereof exceeds a limit. In other words, the stretchable strips 10B start to plastically deform. This kind of region in which the stretchable strips 10B plastically deform is referred to as a "plastic extension region". When the amount of extension of the stretchable strips 10B enters the plastic extension region, the stretchable strips 10B plastically deform and are no longer able to return to the original shape even when the tensile force on the stretchable strips 10B is removed.

If the extension of the stretchable strips 10B is further continued, the stretchable strips 10B become more or less completely extended, and the stretchable strips 10B deteriorate or break at locations where stress is likely to concentrate. For example, it is easy for a breakage to occur at portions near the non-stretchable portions 10A, sharply curved portions, boundary portions between the stretchable strips 10B and electronic component mounting portions, or the like within the stretchable strips 10B.

Figure 9A:
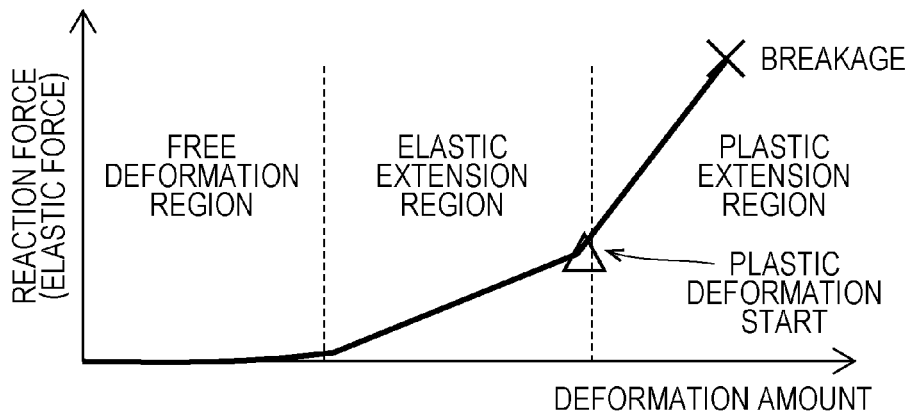
FIG. 9A is a graph depicting an example of the stretching characteristics of a wiring layer.
Figure 9B:
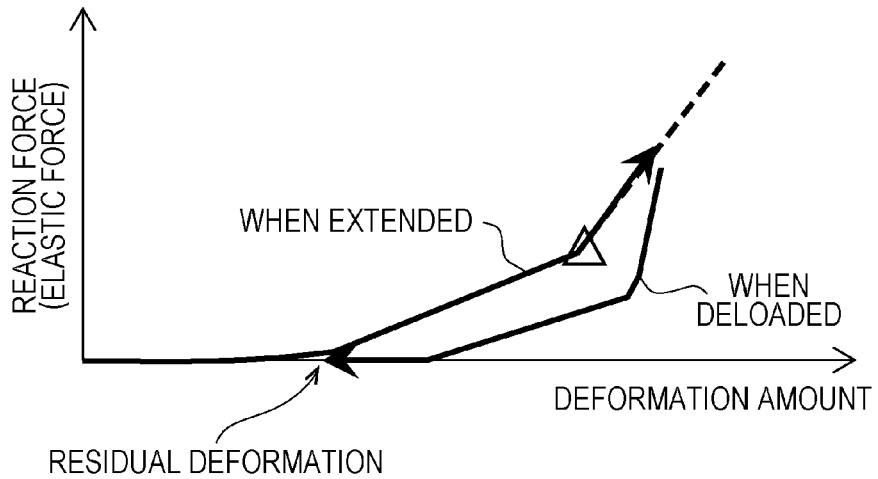
FIG. 9B is a graph depicting an example of the stretching characteristics of a wiring layer.
Figure 9C:
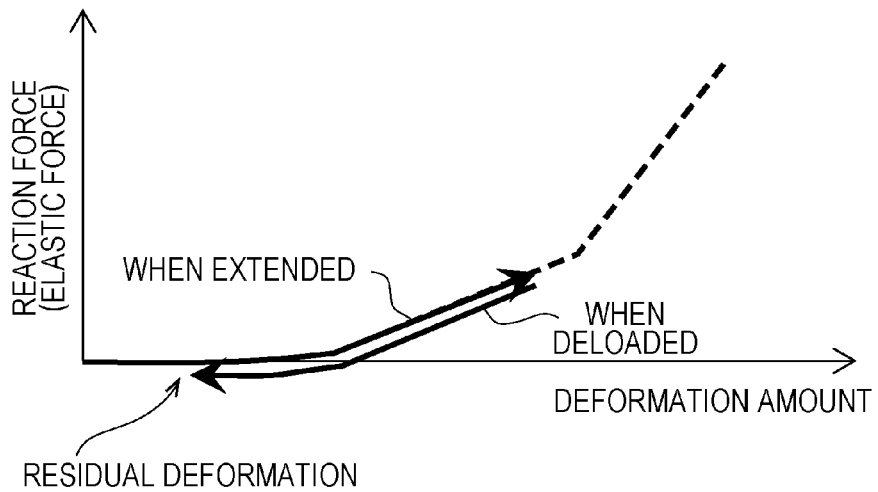
FIG. 9C is a graph depicting an example of the stretching characteristics of a wiring layer.

FIGS. 9A to 9C schematically depict a series of stretching behaviors of the wiring layer 10, in a stretchable flexible substrate that is not provided with the non-linear elastic layer. In the graphs of FIGS. 9A to 9C, the horizontal axes represent the amount of deformation (in other words, the amount of extension), and the vertical axes represent the reaction force (in other words, the elastic force) with respect to tension. In FIGS. 9A to 9C, "Δ" indicates a point where plastic deformation starts, and "x" indicates a point where a breakage occurs. The free deformation region, elastic extension region, and plastic extension region will be described in further detail with reference to FIGS. 9A to 9C.

The graph of FIG. 9A indicates changes in the reaction force of the wiring layer 10 in the case where the tensile force on the wiring layer 10 has continued to increase. Referring to the graph of FIG. 9A, in the free deformation region, the reaction force that occurs in the wiring layer 10 is extremely low, and the wiring layer 10 easily deforms with a small force. In the elastic extension region, a reaction force that attempts to contract to the original shape occurs in the wiring layer 10, and this reaction force increases together with the deformation of the wiring layer 10. When the plastic extension region is entered, the reaction force further increases, and the stretchable strips 10B enter a more or less completely extended state, and thereafter, the wiring layer 10 breaks.

The graph of FIG. 9B indicates changes in the reaction force of the wiring layer 10 in the case where the wiring layer 10 is extended to the plastic extension region, and then the tensile force on the wiring layer 10 is removed before the wiring layer 10 breaks. As mentioned above, when the plastic extension region is entered, the stretchable strips 10B of the wiring layer 10 plastically deform. Therefore, after the tensile force is removed, the deformation remains by an amount proportionate to the plastic deformation, and the stretchable strips 10B enter a slack state without returning to the original shape.

The graph of FIG. 9C indicates changes in the reaction force of the wiring layer 10 in the case where the wiring layer 10 is extended to the elastic extension region, and then the tensile force on the wiring layer 10 is removed before the amount of extension of the wiring layer 10 reaches the plastic extension region. In this case, after the tensile force is removed, the stretchable strips 10B return to the original shape due to the elasticity thereof. However, there are cases where, when deloaded, the stretchable strips 10B may not completely return to the original shape, and some slackness may remain. This is because the reaction force that occurs in the wiring layer 10 is small in the free deformation region.

As mentioned above, with a stretchable flexible substrate that is not provided with the non-linear elastic layer 50, there is concern that when a large tensile force is received, it may not be possible to return to the original shape or the wiring layer may break. In response, the stretchable flexible substrate 100 according to the present embodiment is provided with the non-linear elastic layer 50, thereby eliminating this concern.

Figure 10:
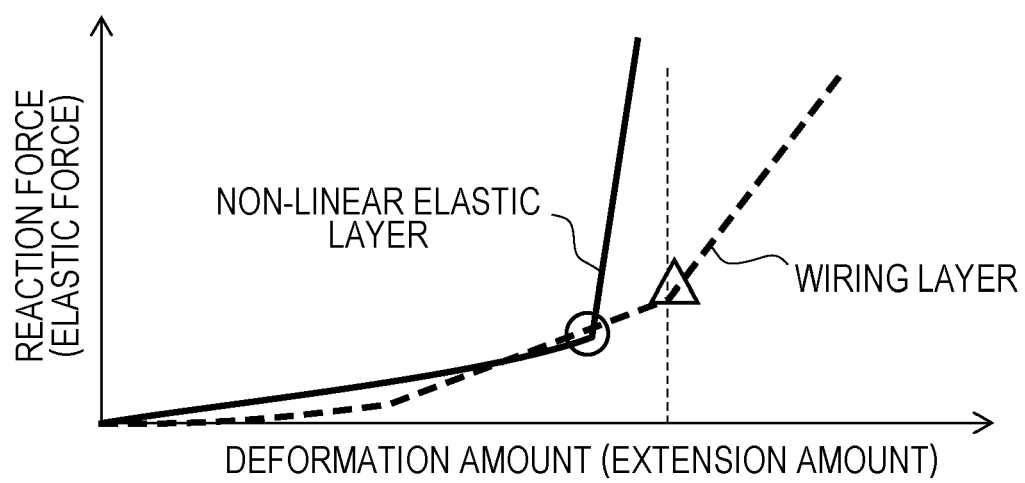
FIG. 10 is a graph depicting an example of the stretching characteristics of a non-linear elastic layer.

FIG. 10 depicts the stretching behavior of the non-linear elastic layer 50 (solid line) and the stretching behavior of the wiring layer 10 (dashed line). In FIG. 10, "○" indicates a point where the reaction force of the non-linear elastic layer 50 rapidly increases, and "Δ" indicates a point where the wiring layer 10 starts to plastically deform.

As is apparent from FIG. 10, the reaction force (in other words, the elastic force) that occurs in the non-linear elastic layer 50 is comparatively small in the region in which the amount of extension is small, and rapidly increases when the amount of extension increases. In FIG. 10, the amount of extension when the reaction force (in other words, the elastic force) of the non-linear elastic layer 50 increases is smaller than the amount of extension when the wiring layer 10 starts to plastically deform. Therefore, a rapid increase in the reaction force of the non-linear elastic layer 50 and further extension of the wiring layer 10 are suppressed before the wiring layer 10 comes to plastically deform. Plastic deformation or a breakage of the wiring layer 10 is thereby prevented. It is desirable for the tensile elastic modulus of the non-linear elastic layer 50 that has increased in this way to far exceed the tensile elastic modulus of the wiring layer 10. Furthermore, it is desirable for the non-linear elastic layer 50 to be able to maintain the large elastic modulus after the elastic modulus has increased. It is thereby possible to suppress the amount of extension of the non-linear elastic layer 50 reaching a level at which the wiring layer 10 is disconnected.

In other words, the non-linear elastic layer 50 has a comparatively low first elastic modulus when the amount of extension is equal to or less than a predetermined value, and has a comparatively high second elastic modulus when the amount of extension exceeds the predetermined value. This "predetermined value", for example, is lower than the amount of extension that causes plastic deformation in the stretchable strips 10B. The second elastic modulus of the non-linear elastic layer 50 is larger than the elastic modulus of the stretchable strips 10B. For example, the first elastic modulus of the non-linear elastic layer 50 is less than or the same as the elastic modulus of the stretchable strips 10B, and the second elastic modulus is 10 or more times greater than the first elastic modulus.

For example, the elastic modulus of the non-linear elastic layer 50 may be of the same order as the elastic modulus of the wiring layer 10 in regions in which the amount of extension is comparatively small (in other words, regions in which the elastic modulus is comparatively small). Thus, the non-linear elastic layer 50 is able to suppress plastic deformation of the wiring layer 10 without greatly inhibiting the elastic extension of the wiring layer 10. For example, when the amount of extension of the non-linear elastic layer 50 is comparatively small, the elastic modulus of the non-linear elastic layer 50 may be 0.1 to less than four times greater than the elastic modulus of the stretchable strips 10B. In other words, $0.1 \leq EM1/EM_{strip} < 4$ is satisfied, where EM1 is the elastic modulus of the non-linear elastic layer 50 and $EM_{strip}$ is the elastic modulus of the stretchable strips 10B.

For example, when the amount of extension of the wiring layer 10 is within the free deformation region, the elastic modulus of the non-linear elastic layer 50 may be larger than the elastic modulus of the wiring layer 10, and small enough so that the free deformation of the wiring layer 10 is not inhibited. Thus, even in the case where the wiring layer 10 does not have a large enough restoring force to be able to return to the original shape by itself in the free deformation region, it is possible to cause the wiring layer 10 to be restored to the original shape due to the elastic force that occurs in the non-linear elastic layer 50. Therefore, it is desirable for the initial elastic modulus of the non-linear elastic layer 50 to be greater than the initial elastic modulus of the stretchable strips 10B. The "initial elastic modulus" mentioned here corresponds to the elastic modulus when the amount of deformation is near zero.

A fiber fabric, for example, may be used as the non-linear elastic layer 50. In other words, the non-linear elastic layer 50 may be a sheet member made of a fiber. The "fiber" mentioned here may be a chemical fiber, a natural fiber, or a mixed fiber thereof.

The chemical fiber may be a synthetic fiber, a semisynthetic fiber, a regenerated fiber, and/or an inorganic fiber. Possible examples of the synthetic fiber are an aliphatic polyamide fiber (for example, a nylon 6 fiber and a nylon 66 fiber), an aromatic polyamide fiber, a polyvinyl alcohol fiber (for example, a vinylon fiber), a polyvinylidene chloride fiber, a polyvinyl chloride fiber, a polyester fiber (for example, a polyester fiber, a PET fiber, a PBT fiber, and a polyarylate fiber), a polyacrylonitrile fiber, a polyethylene fiber, a polypropylene fiber, a polyurethane fiber, a phenol fiber, a polyfluoroethylene fiber, and the like. Possible examples of the semisynthetic fiber are a cellulose fiber, a protein fiber, and the like. Possible examples of the regenerated fiber are a rayon fiber, a cupra fiber, a lyocell fiber, and the like. Also, possible examples of the inorganic fiber are a glass fiber, a carbon fiber, a ceramic fiber, a metal fiber, and the like.

The natural fiber may be a plant fiber, an animal fiber, or a mixed fiber thereof. Possible examples of a plant fiber are cotton, hemp (for example, flax and ramie), and the like. Possible examples of an animal fiber are hair (for example, sheep wool, angora, cashmere, and mohair), silk, plumage (for example, down and feathers), and the like.

The fiber itself that is used for the fiber fabric may be a short fiber or a long fiber, or also may be a hollow fiber. Furthermore, the fiber that is used for the fiber fabric may have a thread form, or a twisted thread form in which fibers are intertwined, for example. The fiber, or a thread made of the fiber, may itself have elastic characteristics.

The fiber fabric may be any of a fiber woven material, a fiber knitted material, and a non-woven fabric. That is, the fiber fabric may be a woven material into which so-called warp threads and weft threads have been woven in such a way as to intersect, or may be a mesh material into which threads are woven in such a way as to bend. Alternatively, the fiber fabric may be a non-woven fabric (for example, a needle-punch fabric or a spunbond fabric).

The non-linear elastic layer 50 may have a knitted structure. A fiber fabric having a knitted structure deforms when pulled, practically returns to the original shape when deloaded, and when the amount of deformation caused by pulling exceeds a predetermined level, the reaction force (in other words, the elastic force) rapidly increases. This is because a knitted material, having a configuration in which fiber threads are entwined in a bending form, is able to flexibly extend due to the bending deformation, but, when the bending is eliminated, the extension allowance is lost and the extension itself is restricted.

Figure 11A:
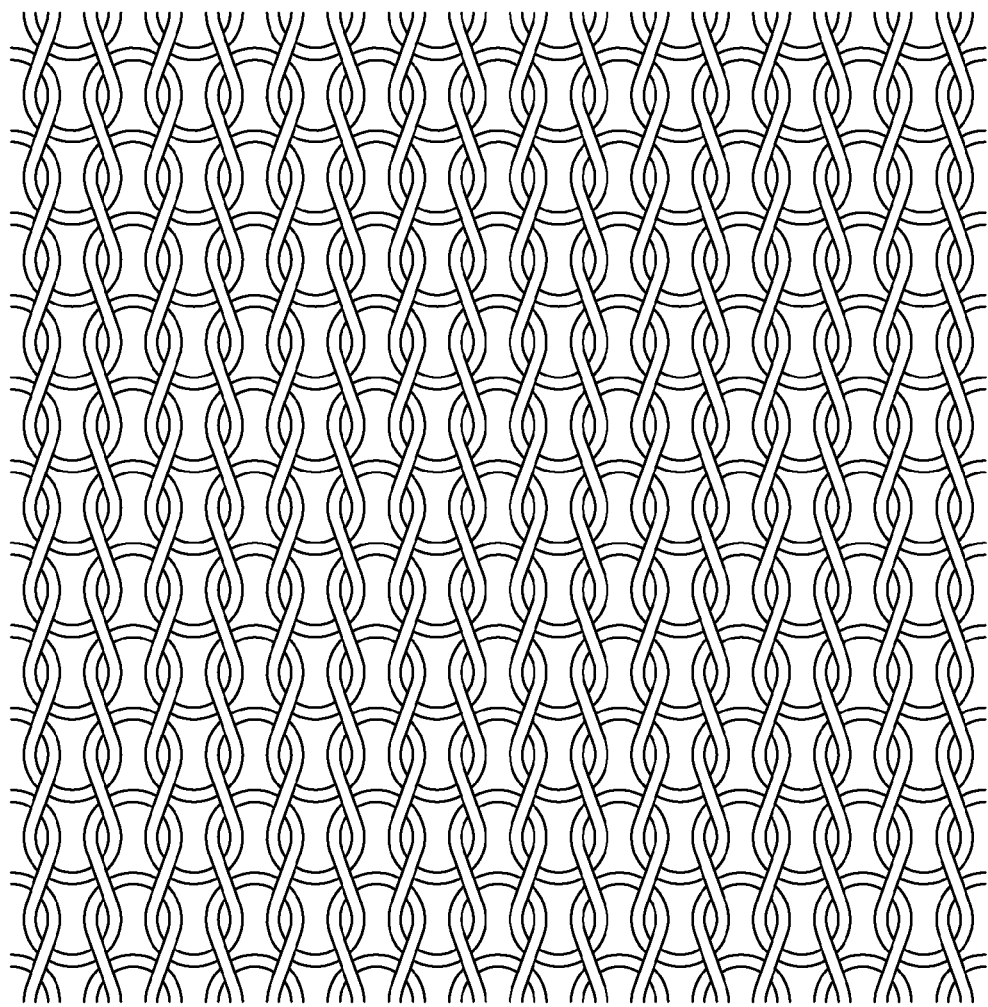
FIG. 11A is a drawing schematically depicting a fiber knitted material having a knitted structure.
Figure 11B:
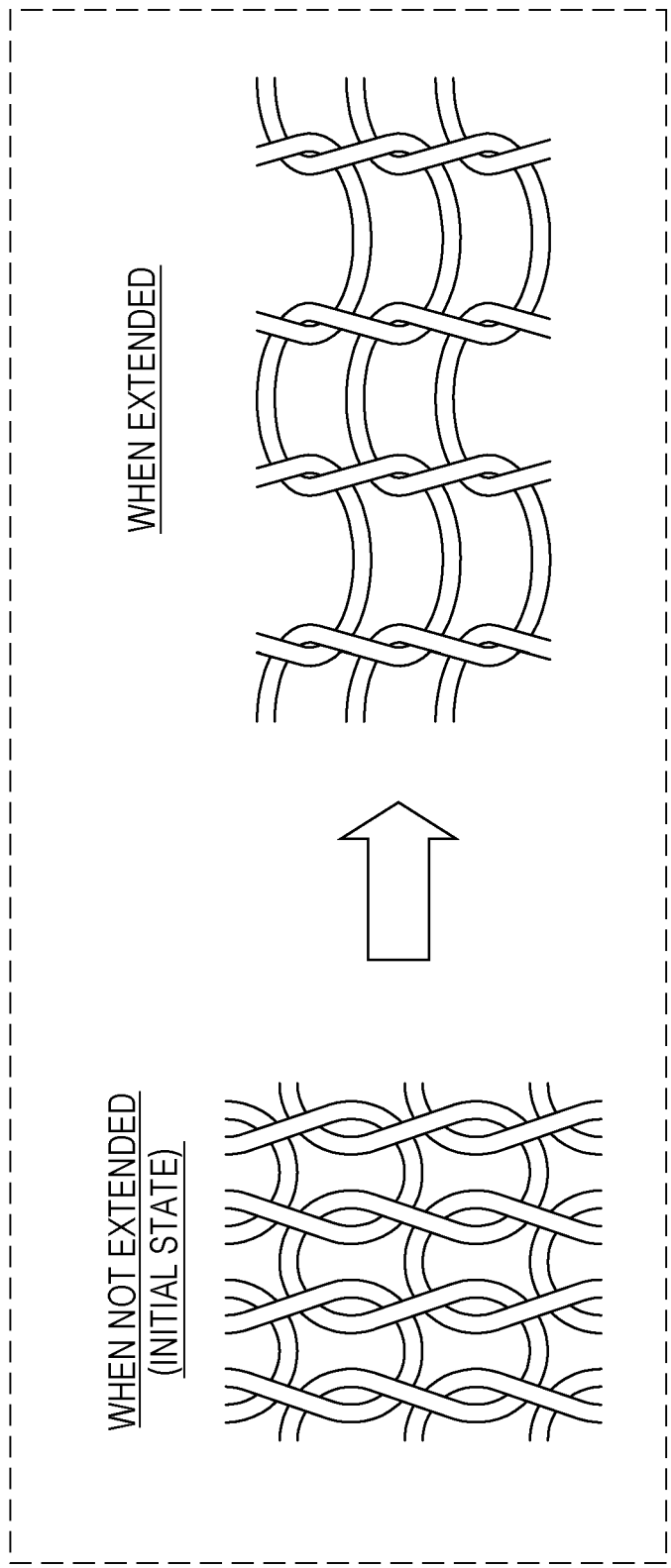
FIG. 11B is a schematic drawing for illustrating deformation of a fiber knitted material having a knitted structure.

The non-linear elastic layer 50 may have a knitted structure. FIGS. 11A and 11B depict an example of a knitted structure. A knitted material having a knitted structure is knitted while adjacent fiber threads are entwined together. In a knitted structure, when focusing on a single fiber thread, the fiber thread is entwined with adjacent fiber threads in an alternating manner while forming a serpentine shape as depicted in the drawings. Since the fiber thread has a serpentine shape, an extension allowance with respect to tension is sufficiently ensured. Knitted structures, for example, are used as material for sweaters, jerseys, stockinette stitch shirts, or the like. A fiber knitted material having this kind of knitted structure has abundant flexibility and stretchability in regions in which the amount of extension is comparatively small, and when extension advances and a state is entered in which the fiber threads are more or less completely extended, the reaction force rapidly increases and further extension becomes difficult.

The strength of a single fiber thread used for knitting may be less than the strength of the wiring layer 10. In this case, for example, it is desirable for a plurality of the fiber threads to be able to suppress the plastic deformation and breaking of a single stretchable strip 10B when extended. The fiber used for the knitted structure, for example, may be a fiber having strong elasticity such as a nylon fiber. Thus, the knitted structure is able to have the strength to restore the stretchable strips 10B to the original shape.

Figure 12A:
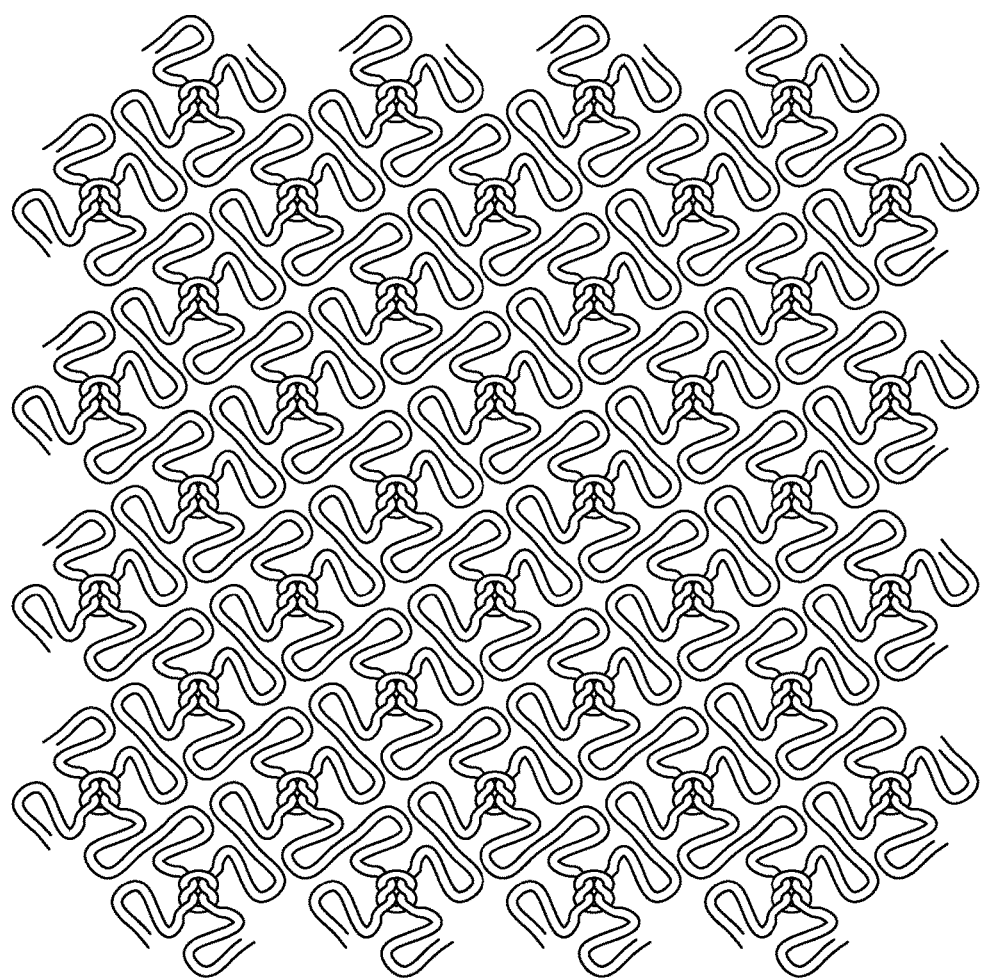
FIG. 12A is a drawing schematically depicting a fiber knitted material having a net structure.

The non-linear elastic layer 50 may have a net structure. FIGS. 12A and 12B depict an example of a net structure. In a material having a net structure, fiber threads are tied at intersecting points to form a lattice shape, and fiber threads linking lattice points form a serpentine shape having allowance. The fiber threads of the net structure have a serpentine shape when not extended, and when completely extended, the reaction force rapidly increases, and further extension becomes difficult.

The non-linear elastic layer 50 may be a composite of a fiber fabric and an elastomer. Elastomers have low elasticity and have the restoring force to return to the original shape. Therefore, a composite of a fiber fabric and an elastomer is able to have an initial elastic modulus that is higher than the initial elastic modulus of the stretchable strips 10B. Therefore, this composite is able to act in such a way as to return the wiring layer 10 in the free deformation region to the original shape. The elastomer is not particularly restricted; however, a possible example thereof is a polyurethane material (for example, a polyurethane sheet). The composite may be a layered body in which a fiber fabric and an elastomer are overlapped with each other in a layered form, or may be a mixture in which a fiber fabric and an elastomer are mixed.

(Exemplary Mode of Stretchable Flexible Substrate)

Figure 13:
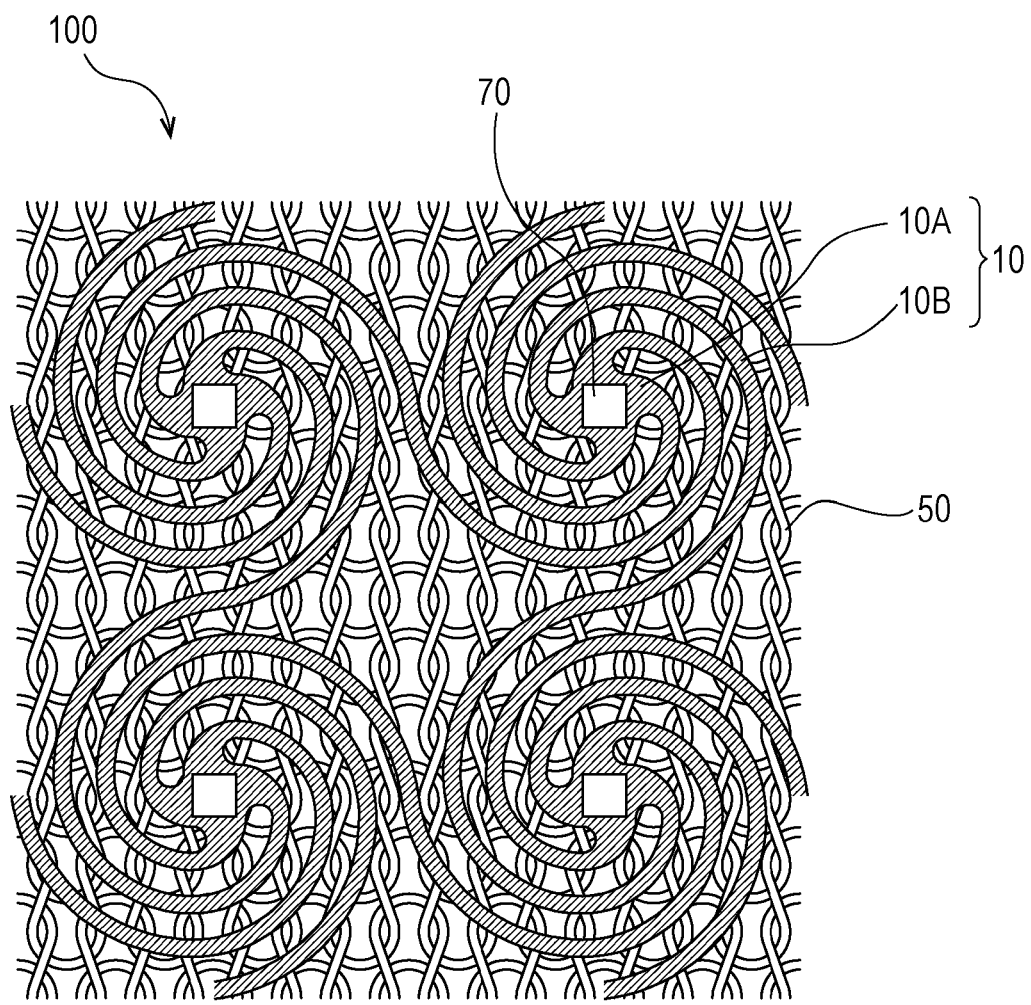
FIG. 13 is a drawing schematically depicting a stretchable flexible substrate according to an embodiment.

One exemplary configuration of the stretchable flexible substrate 100 will be described in detail. FIG. 13 depicts a stretchable flexible substrate 100 provided with a wiring layer 10 that includes stretchable strips 10B curved in a spiral shape, and a non-linear elastic layer 50 configured from a fiber knitted material.

In the wiring layer 10, a plurality of non-stretchable portions 10A are arranged in a two-dimensional matrix form, and a plurality of stretchable strips 10B link the non-stretchable portions 10A. In other words, the non-stretchable portions 10A are arranged in positions corresponding to intersecting points of the plurality of stretchable strips 10B. The plurality of non-stretchable portions 10A are scattered in an island-like manner. Electronic components 70 are mounted on the non-stretchable portions 10A. The plurality of stretchable strips 10B curve in a spiral shape about the non-stretchable portions 10A. The stretchable strips 10B curve in a point symmetrical manner between mutually adjacent non-stretchable portions. That is, the curving direction of the stretchable strips 10B inverts between two adjacent non-stretchable portions 10A.

Figure 14A:
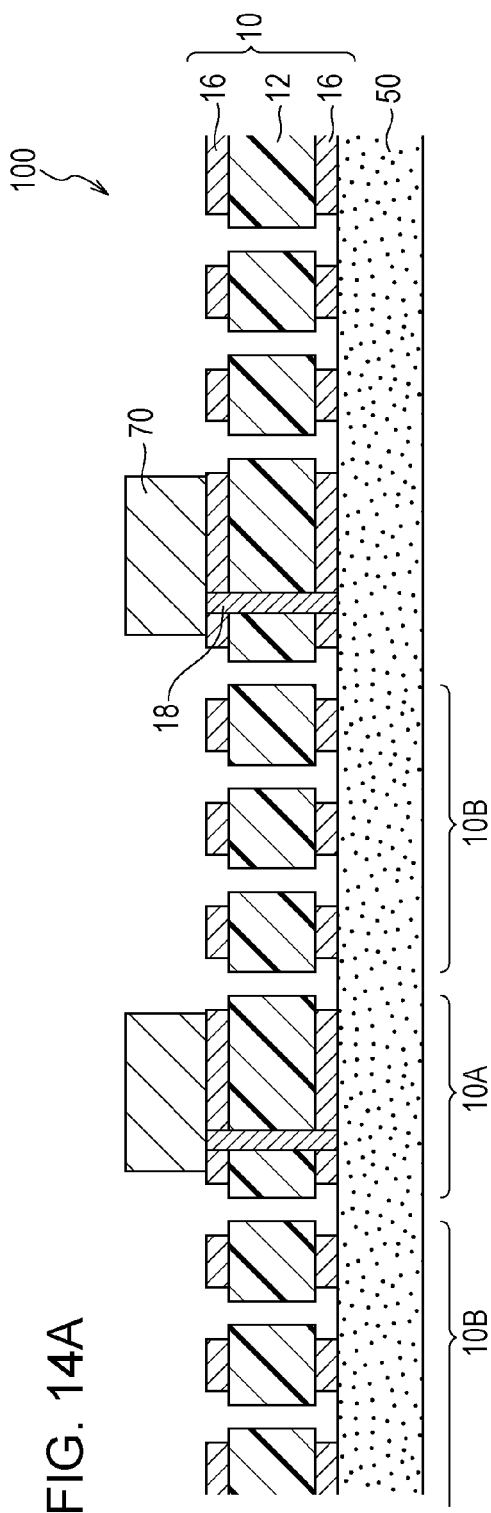
FIG. 14A is a cross-sectional drawing schematically depicting an example of a configuration of a stretchable flexible substrate according to an embodiment.
Figure 14B:
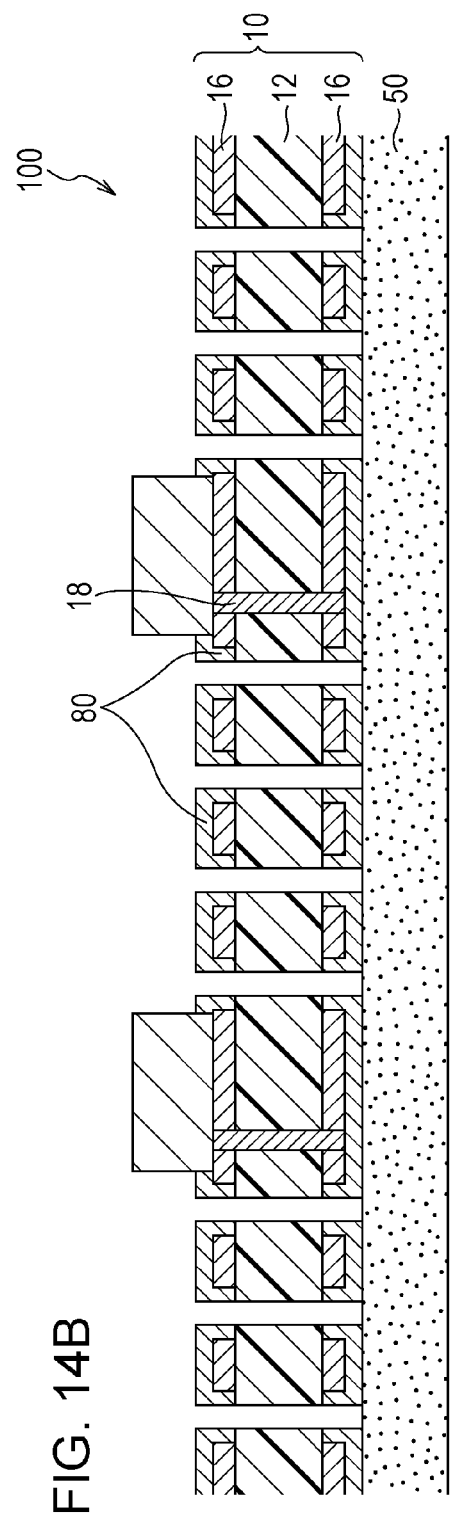
FIG. 14B is a cross-sectional drawing schematically depicting an example of a configuration of a stretchable flexible substrate according to an embodiment.

FIGS. 14A and 14B depict cross-sectional schematic drawings of the wiring layer 10 provided with the stretchable strips 10B curved in a spiral shape. In the depicted examples, electrically conductive wiring 16, an insulating base material 12, and electrically conductive wiring 16 are layered in this order in the wiring layer 10. A polyimide film may be used as the insulating base material 12, and pattern-formed copper foil may be used as the electrically conductive wiring 16, for example. The non-stretchable portions 10A may have vias, and electrically conductive members 18 that electrically connect the front surface-side electrically conductive wiring 16 and the rear surface-side electrically conductive wiring 16 to each other may be provided within these vias. The electronic components 70 are mounted on the non-stretchable portions 10A. As depicted in FIGS. 14A and 14B, between adjacent non-stretchable portions 10A, the spiral-shaped stretchable strips 10B extend with gaps therebetween. Such gaps assist the flexible deformation of the stretchable strips 10B. It should be noted that the non-stretchable portions 10A and the stretchable strips 10B may be integrated with each other without joints. The insulating base material 12 forming part of the non-stretchable portions 10A and the stretchable strips 10B may be formed by laser processing one film (for example, a polyimide film). As depicted in FIG. 14B, a sealing layer 80 for sealing the entirety of the electrically conductive wiring 16 is provided, for example.

It is desirable for the non-linear elastic layer 50 to be formed from a fiber knitted material. The non-linear elastic layer 50 depicted in FIG. 13 has a knitted structure. The non-linear elastic layer 50 and the wiring layer 10 may be joined by way of an adhesive material, for example.

FIG. 15 depicts another configuration example of the stretchable flexible substrate 100. The stretchable flexible substrate 100 depicted in FIG. 15 has an elastomer 50b provided between the wiring layer 10 and a fiber fabric 50a. In other words, the non-linear elastic layer 50 includes the fiber fabric 50a and the elastomer 50b.

A thermoplastic polyurethane sheet may be used as the elastomer 50b, for example. A thermoplastic polyurethane sheet is able to function as an adhesive layer that joins the fiber fabric 50a and the wiring layer 10 to each other. That is, by interposing a thermoplastic polyurethane sheet between the wiring layer 10 and the fiber fabric 50a and applying thermocompression bonding, the joining thereof can be performed in a simple manner.

Hereinabove, a description has been given regarding a stretchable flexible substrate according to an embodiment; however, the present disclosure is not restricted thereto, and various alterations can be implemented by a person skilled in the art.

For example, the non-linear elastic layer 50 is not particularly restricted to a fiber fabric. A material may be desirably used as the non-linear elastic layer as long as the material is a structure that has allowance and has a low reaction force and/or low elastic force when extension is low, and yet is a material in which, when a predetermined extension rate is reached and the allowance of the material is lost, the tensile elastic modulus thereby rapidly increases and the reaction force and/or elastic force increases.

A stretchable flexible substrate of the present disclosure is able to be used in the field of electronic devices, the field of wearable devices, the health care field, the medical field, and the nursing field.

What is claimed is:

1. A flexible substrate, comprising:
a stretchable sheet;
a member located on the sheet; and
a stretchable strip connected to the member, and located on the sheet,
wherein, when an amount of extension of the sheet is equal to or less than a predetermined value, the sheet has a first elastic modulus,
and, when the amount of extension of the sheet exceeds the predetermined value, the sheet has a second elastic modulus that is greater than the first elastic modulus and greater than an elastic modulus of the strip.

2. The flexible substrate according to claim 1, comprising:
a plurality of members located on the sheet; and
a plurality of stretchable strips that connect the plurality of members on the sheet,
wherein the member is one of the plurality of members, and the strip is one of the plurality of strips.

3. The flexible substrate according to claim 1,
wherein the predetermined value is smaller than an amount of extension with which plastic deformation is caused in the strip.

4. The flexible substrate according to claim 1,
wherein the second elastic modulus is 10 or more times greater than the first elastic modulus.

5. The flexible substrate according to claim 1,
wherein, when the amount of extension of the sheet is equal to or less than the predetermined value, the first elastic modulus $EM1_{sheet}$ of the sheet and the elastic modulus $EM_{strip}$ of the strip satisfy $0.1 \leq EM1_{sheet}/EM_{strip} < 4$.

6. The flexible substrate according to claim 1,
wherein an initial elastic modulus of the sheet is greater than an initial elastic modulus of the strip.

7. The flexible substrate according to claim 1,
wherein the strip is curved.

8. The flexible substrate according to claim 7,
wherein the strip has a serpentine shape.

9. The flexible substrate according to claim 7,
wherein the strip has a spiral shape that extends along at least half of a perimeter of the member.

10. The flexible substrate according to claim 1,
wherein the member is a flat sheet that includes an electrically conductive layer.

11. The flexible substrate according to claim 1,
wherein the strip includes electrically conductive wiring.

12. The flexible substrate according to claim 11,
wherein the strip further includes an insulating member.

13. The flexible substrate according to claim 1,
wherein the sheet includes a fiber fabric.

14. The flexible substrate according to claim 13,
wherein the fiber fabric has a knitted structure.

15. The flexible substrate according to claim 13,
wherein the fiber fabric has a net structure.

16. The flexible substrate according to claim 13,
wherein the fiber fabric further includes an elastomer.

17. The flexible substrate according to claim 1, further comprising:
a stretchable insulating member connected to the member, and located on the sheet,
wherein the strip is located on the insulating member.

18. The flexible substrate according to claim 1, further comprising:
an electronic component located on the member.

19. The flexible substrate according to claim 1, wherein the member is a non-stretchable member.

* * * * *